(12) United States Patent
Leitão et al.

(10) Patent No.: US 12,210,080 B2
(45) Date of Patent: Jan. 28, 2025

(54) METHOD OF OPERATING A MAGNETIC RESONANCE SCANNER

(71) Applicants: David Leitão, Staines (GB); Raphael Tomi-Tricot, London (GB); Joseph V. Hajnal, London (GB); Shaihan Malik, London (GB)

(72) Inventors: David Leitão, Staines (GB); Raphael Tomi-Tricot, London (GB); Joseph V. Hajnal, London (GB); Shaihan Malik, London (GB)

(73) Assignees: King's College London, London (GB); Siemens Healthineers AG, Forchheim (DE)

( * ) Notice: Subject to any disclaimer, the term of this patent is extended or adjusted under 35 U.S.C. 154(b) by 107 days.

(21) Appl. No.: 17/955,924

(22) Filed: Sep. 29, 2022

(65) Prior Publication Data

US 2023/0096478 A1    Mar. 30, 2023

(30) Foreign Application Priority Data

Sep. 29, 2021    (GB) ..................... 2113948

(51) Int. Cl.
*G01V 3/00*    (2006.01)
*G01R 33/48*    (2006.01)
(Continued)

(52) U.S. Cl.
CPC ....... *G01R 33/543* (2013.01); *G01R 33/4828* (2013.01); *G01R 33/5659* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS 8,473,536 B2 *   6/2013   Balchandani .......... G01R 33/44
                                                         708/131
9,575,154 B2 *   2/2017   Simonetti ............ G01R 33/583
(Continued)

FOREIGN PATENT DOCUMENTS

CN       103069296 B   * 12/2015   ........... G01R 33/246
WO       2011128847 A1   10/2011

OTHER PUBLICATIONS

Cloos, M. A., et al. "kT-points: short three-dimensional tailored RF pulses for flip-angle homogenization over an extended volume." Magnetic Resonance in Medicine 67.1 (2012): 72-80.
(Continued)

*Primary Examiner* — Walter L Lindsay, Jr.
*Assistant Examiner* — Frederick Wenderoth
(74) *Attorney, Agent, or Firm* — Lempia Summerfield Katz LLC

(57) ABSTRACT

A method of operating a magnetic resonance scanner includes determining a radio frequency (RF) pulse to be transmitted to jointly homogenize a flip angle and a semi-solid saturation that would result from magnetization of a sample to be scanned by the MR scanner using the determined RF pulse. The method also includes controlling an RF transmit coil of the MR scanner to transmit the determined pulse. Homogenizing both semisolid saturation and excitation properties of the RF pulse allows for improved magnetic transfer ratio imaging.

18 Claims, 11 Drawing Sheets

(51) Int. Cl.
*G01R 33/54* (2006.01)
*G01R 33/565* (2006.01)

(58) Field of Classification Search
USPC .......................................................... 324/309
See application file for complete search history.

(56) References Cited

U.S. PATENT DOCUMENTS

| | | | |
|---|---|---|---|
| 2008/0176946 A1* | 7/2008 | Ossovskaya | A61P 31/00 |
| | | | 514/617 |
| 2013/0038326 A1 | 2/2013 | Amadon et al. | |
| 2018/0252788 A1* | 9/2018 | Boulant | G01R 33/5612 |
| 2019/0219646 A1* | 7/2019 | Dmochowski | A61K 49/0008 |
| 2019/0242962 A1* | 8/2019 | Paul | G01R 33/583 |

OTHER PUBLICATIONS

Da Silva, Nuno André, et al. "B1+ inhomogeneity mitigation in CEST using parallel transmission: pTxCEST." Magnetic Resonance in Medicine 78:2216-2225 (2017).

De Boer, R. W. "Magnetization transfer contrast Part 2: Clinical applications." MedicaMundi 40 (1995): 74-83.

Graham, S. J., and R. Mark Henkelman. "Understanding pulsed magnetization transfer." Journal of Magnetic Resonance Imaging 7.5 (1997): 903-912.

Grissom, William, et al. "Spatial domain method for the design of RF pulses in multicoil parallel excitation." Magnetic Resonance in Medicine: An Official Journal of the International Society for Magnetic Resonance in Medicine 56.3 (2006): 620-629.

Henkelman, R. M., G. J. Stanisz, and S. J. Graham. "Magnetization transfer in MRI: a review." NMR in Biomedicine: An International Journal Devoted to the Development and Application of Magnetic Resonance In Vivo 14.2 (2001): 57-64.

Huang, Sheng-Min, et al. "Investigation of readout RF pulse impact on the chemical exchange saturation transfer spectrum." Scientific reports 5.1 (2015): 1-8.

Huiwen, Luo et al: "Tailored spectral-spatial saturation for uniform saturation in CESC imaging"; Proceedings of the ISMRM & SMRT Virtual Conference & Exhibition, Aug. 8-14, 2020; No. 507, Jul. 24, 2020.

Leitão, David, et al. "Parallel transmit pulse design for saturation homogeneity (PUSH) for magnetization transfer imaging at 7T." Magnetic resonance in medicine 88.1 (Mar. 2022): 180-194.

Leitão, David, et al. "Uniform Magnetization Transfer contrast at 7T with Direct Saturation Control." 2021. pp. 1-5.

Malik, Shaihan J., et al. "Tailored excitation in 3D with spiral nonselective (SPINS) RF pulses." Magnetic resonance in medicine 67.5 (2012): 1303-1315.

Malik, Shaihan J., Rui Pedro AG Teixeira, and Joseph V. Hajnal. "Extended phase graph formalism for systems with magnetization transfer and exchange." Magnetic resonance in medicine 80.2 (2018): 767-779.

Melki, P. S., and R. V. Mulkern. "Magnetization transfer effects in multislice RARE sequences." Magnetic resonance in medicine 24.1 (1992): 189-195.

Weigel, Matthias, Gunther Helms, and Juergen Hennig. "Investigation and modeling of magnetization transfer effects in two-dimensional multislice turbo spin echo sequences with low constant or variable flip angles at 3 T." Magnetic Resonance in Medicine: An Official Journal of the International Society for Magnetic Resonance in Medicine 63.1 (2010): 230-234.

* cited by examiner

METHOD OF OPERATING A MAGNETIC RESONANCE SCANNER

This application claims the benefit of UK Patent Application No. GB 2113948.0, filed on Sep. 29, 2021, which is hereby incorporated by reference in its entirety.

FIELD

The present disclosure relates to radiofrequency (RF) pulse design for a magnetic resonance scanner. More specifically, the disclosure is concerned with designing radiofrequency (RF) pulses that optimize both flip angle and power optimization for controlled magnetization transfer in a sample in order to perform magnetic contrast imaging.

BACKGROUND

Magnetization transfer (MT) imaging is an effect that may be exploited in a number of clinical applications, be it to improve gadolinium enhancement visualization, to improve background suppression in time-of-flight angiography, or as an early marker of demyelination (e.g., in multiple sclerosis). In some instances, MT may create artifacts when it is not needed but is still observed in conventional imaging, as all pulses generate MT.

In one way to perform MT imaging, an off-resonance radiofrequency (RF) pulse (e.g., an RF pulse with frequency different to the Larmor frequency of free-water protons) is applied to a sample with a semisolid proton fraction. Protons in the semisolid pool receive energy that is partly transferred to free water protons; the latter become saturated, and their measured signal is lower. The saturating pulse is followed by a readout sequence (e.g., typically at the Larmor frequency of the free-water protons) to measure the free water signal. A typical way of measuring the MT effect is to display a MT ratio (MTR) image, which is defined as 1 minus the ratio between a MT-saturated readout and a non-saturated readout.

Systems with MT are particularly sensitive to $B_1^+$ inhomogeneity. Indeed, the amount of semisolid saturation depends on the RF power applied off-resonance, which is related to the square of $B_1^+$. To use MT for imaging, the most homogeneous saturation as possible is to be obtained. However, providing that the excitation pulse for readout has a minimal impact on the MT contrast homogeneity remains a challenge.

SUMMARY

The scope of the present invention is defined solely by the appended claims and is not affected to any degree by the statements within this summary.

The present embodiments may obviate one or more of the drawbacks or limitations in the related art. For example, one or more of the challenges that currently arise from magnetization transfer (MT) imaging may be overcome.

In one aspect of the present embodiments, a method of operating a magnetic resonance (MR) scanner includes determining a radio frequency (RF) pulse to be transmitted to jointly homogenize a flip angle and a semisolid saturation that would result from magnetization of a sample to be scanned by the MR scanner using the determined RF pulse, and controlling an RF transmit coil of the MR scanner to transmit the determined pulse. The RF pulse may be applied to both saturation and excitation (e.g., readout) pulses in MT contrast imaging, or to just the readout pulse in other types of imaging. In the former case, homogenizing both semisolid saturation and excitation properties provides improved magnetization transfer ratio (MTR) images compared with prior art techniques. In the latter case, undesirable MT effects in more conventional imaging (e.g., T1w or T2w) may be readily minimized (e.g., controlled). Here, homogenizing may be minimizing the deviation in the measured flip angle and in semisolid saturation from their respective average (or target) value.

In one example, the act of determining the RF pulse to be transmitted includes applying a weight to a component of the RF pulse design that determines the flip angle of the sample, a component of the RF pulse design that determines the semisolid saturation of the sample when magnetized, or both, respectively. In this way, the two aspects that contribute to the imaging experiment (e.g., the rotation by the flip angle and the magnetization saturation) may be readily fine-tuned to prioritize one aspect over the other as needed.

In one example, the weights are determined by a common trade-off factor that varies between 0 and 1 (exclusive). In this way, the weighting may be more readily applied, and more easily adjusted, within the RF pulse design framework. Trade-off factors of 0 and 1 corresponding to designing an RF pulse that ignores saturation or flip angle in the pulse design, which would therefore not achieve the desired homogenization. In one embodiment, the trade-off factor is between 0.2 and 0.8, inclusive, but may depend on the application.

In one example, determining the RF pulse to be transmitted includes selecting a target flip angle, a target saturation, or the target flip angle and the target saturation, and minimizing a deviation of the flip angle and saturation with respect to the target value, as appropriate. In one example, a target power for the RF pulse is used in place of saturation. Suitably, the design of the RF pulse may be varied according to flip angle and saturation desired for a particular purpose or that may be suitable for a particular MR scanner.

In one example, the target flip angle and target saturation/power are based on safety constraints and hardware constraints of the MR scanner. An example safety constraint is patient specific absorption rate. Example hardware constraints include RF peak power, RF average power, static field gradient amplitude, and static field gradient slew rate of the MR scanner. In one embodiment, the RF pulse may be tailored for purpose for the specific patient and specific scanner.

In one example, the method further includes acquiring at least one image of the sample scanned by the MR scanner using the determined RF pulse (e.g., to obtain an MTR image). Further, the image may be used as basis for adjusting the determined RF pulse. For example, parameters of the RF pulse (e.g., the trade-off factor) may be varied with the aim of achieving a different or improved contrast. In this way, the design of the RF pulse is iterative until desired results are achieved.

In another aspect of the present embodiments, a magnetic resonance imaging (MRI) apparatus including a magnetic resonance (MR) scanner and a computer for controlling operation of the MR scanner is provided. The computer is configured to perform the method(s) described above or otherwise described herein. The present techniques are suited for deployment on an MR scanner including multiple parallel transmit RF coils (e.g., a parallel transmit capable 'pTx' scanner), such that the determined pulse is transmitted by the parallel transmit RF coils in combination.

In another aspect of the present embodiments, a computer program including instructions that, when executed by a computer controlling an operation of a magnetic resonance 'MR' scanner, carry out the method(s) above and otherwise described herein is provided. In another aspect of the present embodiments, a computer-readable storage medium (e.g., a non-transitory computer-readable storage medium) having stored thereon the aforementioned computer program is provided.

The present techniques also provide for a non-transitory data carrier carrying code that, when implemented by a computer controlling an operation of a magnetic resonance (MR) scanner, carries out the method(s) above or otherwise described herein.

BRIEF DESCRIPTION OF THE DRAWINGS

Examples of the present disclosure will now be described by way of example only with reference to the accompanying drawings, in which.

DETAILED DESCRIPTION

Figure 1:
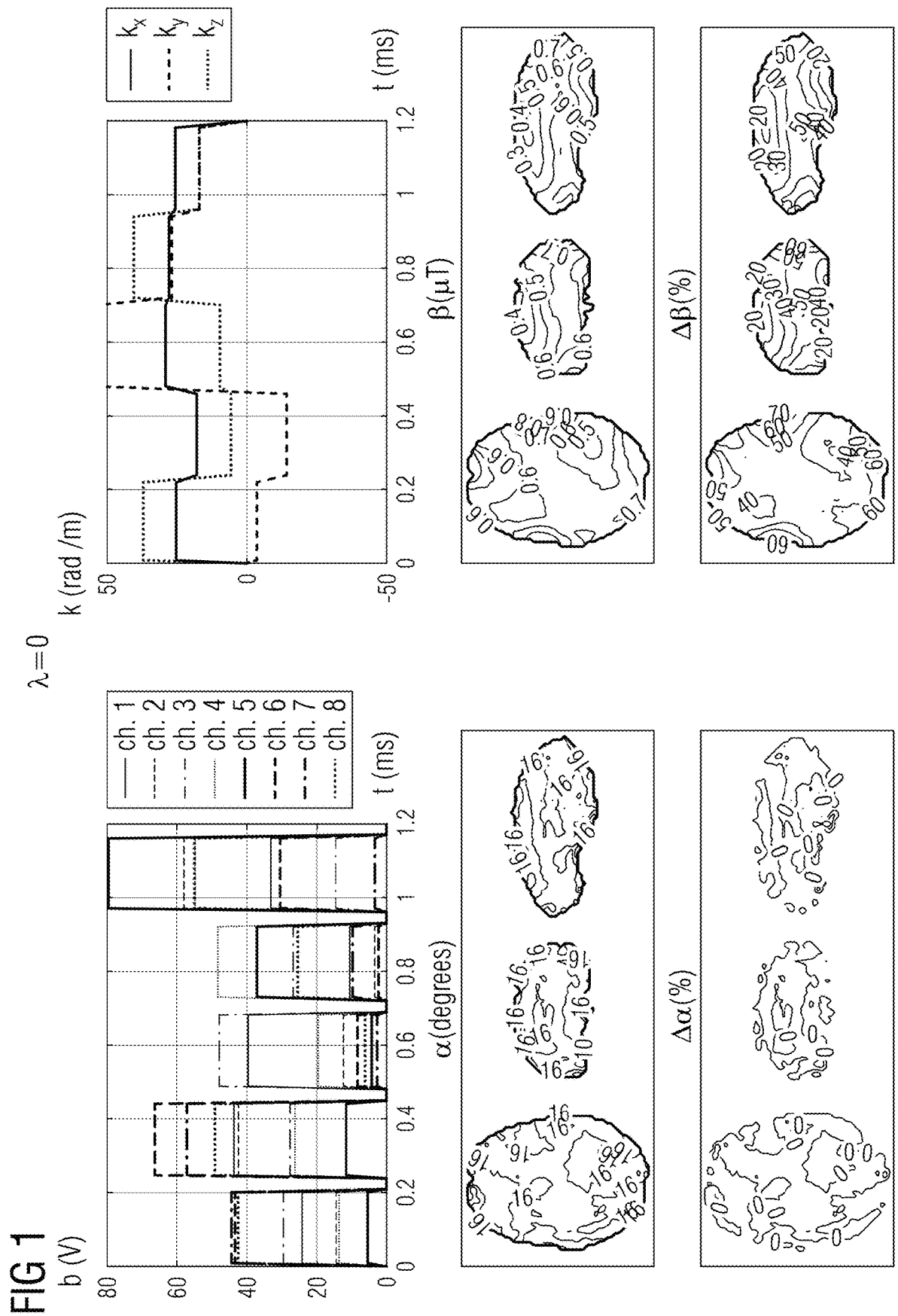
FIGS. 1 to 6 show example measurements of radio frequency (RF) amplitude, scanner gradient moments, flip angle, saturation (as a measure of $B_1^+$ RMS) and errors in flip angle and saturation when homogenizing flip angle and saturation within a kT-points framework.

The challenge for designing a radio frequency (RF) pulse for magnetization transfer (MT) imaging is twofold: (a) to maximize a signal to noise ratio (SNR) of the MTR, one typically wants to use a readout flip angle as close as possible to an Ernst angle (which depends on a sequence TR and a tissue T1), and the flip angle is to be as homogeneous as possible (this usually requires advanced pulse design methods, such as SPINS or kT-points); and (b) the MT effect arising from the readout RF depends on the semisolid saturation that relates to $B_1^+)^2$, which is not necessarily directly related to the flip angle in the case of SPINS and kT-points. It is therefore desirable that $B_1^+)^2$ is also controlled and, for example, as homogeneous as possible.

Prior art solutions looking to address (a) lower the readout flip angle. Thus, $B_1^+$ does not have to be as accurately controlled (e.g., effects of inhomogeneity are lessened). The immediate drawback is that the SNR of the MTR becomes lower.

Prior art solutions looking to address (b) use RF shimming to target a homogeneous B1+ to achieve the flip angle, but is not very effective for scanning samples at high field (e.g., in the brain at 7 Tesla (T)). More advanced techniques such as kT-points or SPINS use gradient fields to tailor magnetization beyond the homogeneity of $B_1^+$ but take the view that the flip angle may be ignored entirely.

The approach taken by the present disclosure is to address both of these problems simultaneously. Broadly, disclosed herein is a pulse design framework to jointly homogenize flip angle and RF saturation power. In other words, the techniques discussed herein aim to homogenize the flip angle while also suitably controlling the energy input to minimize deviations of $B_1^+)^2$.

Principles of Magnetization Transfer. The dynamics of free water (f) magnetization $M^f=[M_x^f M_y^f M_z^f]^T$ are described by the Bloch equation:

$$\frac{dM^f}{dt} = \left( \begin{bmatrix} 0 & \gamma\Delta B_z & -\gamma B_{1,y} \\ -\gamma\Delta B_z & 0 & \gamma B_{1,x} \\ \gamma B_{1,y} & -\gamma B_{1,x} & 0 \end{bmatrix} + \begin{bmatrix} -R_2^f & 0 & 0 \\ 0 & -R_2^f & 0 \\ 0 & 0 & -R_1^f \end{bmatrix} \right) M^f + \begin{bmatrix} 0 \\ 0 \\ R_1^f M_0^f \end{bmatrix} = \quad [1]$$

$$(A+E)M^f + c.$$

Here, A includes RF($B_1^+=B_{1,x}+iB_{1,y}$) and local field variations ($\Delta B_z=\Delta B_0+G\cdot r$) at coordinates r induced by off-resonance $\Delta B_0$ and gradients G. Operators E and c contain relaxation effects through the relaxation rates $R_1^{f(=1/T_1^f)}$ and $R_2^f(=1/T_2^f)$, and $M_0^f$ is the equilibrium magnetization.

Systems with magnetization transfer may be described by the Binary Spin Bath (BSB) model that contains two pools corresponding to free water (f) and semisolid (s) magnetization:

$$\frac{d}{dt}\begin{bmatrix} M^f \\ M_z^s \end{bmatrix} = \quad [2]$$

$$\left( \begin{bmatrix} A & 0 \\ 0 & -\langle W \rangle \end{bmatrix} + \begin{bmatrix} -R_2^f & 0 & 0 & 0 \\ 0 & -R_2^f & 0 & 0 \\ 0 & 0 & -k_{fs}-R_1^f & k_{sf} \\ 0 & 0 & k_{fs} & -k_{sf}-R_1^s \end{bmatrix} \right) \begin{bmatrix} M^f \\ M_z^s \end{bmatrix} +$$

$$\begin{bmatrix} c \\ R_1^s M_0^s \end{bmatrix} = (\tilde{A}+\tilde{E})\begin{bmatrix} M^f \\ M_z^s \end{bmatrix} + \tilde{c}.$$

The operators $\tilde{A}$, $\tilde{E}$ and $\tilde{c}$ include the effects of RF ($\tilde{A}$), gradients ($\tilde{A}$), relaxation ($\tilde{E}\&\tilde{c}$), and exchange ($\tilde{E}$). In these expressions, $R_1^s(=1/T_1^s)$ is the semisolid longitudinal relaxation rate, $M_0^s$ is the semisolid equilibrium magnetization, $k_{fs}$ is the exchange rate from $M_z^f$ to $M_z^s$ (vice-versa for $k_{sf}$), and $\langle W \rangle$ is the average saturation rate that models the semisolid response to RF. In case of RF irradiation at a single off-resonance frequency ω, then $\langle W \rangle$ is given by $$\langle W \rangle = \pi\gamma^2 g(\omega - \gamma\Delta B_z, T_s^s)\frac{1}{\tau}\int_0^\tau |B_1^+(t)|^2 dt = \pi\gamma^2 g(\omega - \gamma\Delta B_z, T_s^s)\langle |B_1^+|^2 \rangle. \quad [3]$$

Here, $\langle |B_1^+|^2 \rangle$ is the mean squared $B_1^+$ over duration τ, and g is the semisolid absorption lineshape that depends on its transverse relaxation time $T_2^s$ and on the frequency shift ω−γ$\Delta B_z$. Typically, the absorption lineshape has much broader bandwidth than the RF or local field variations in the absence of gradients, such that $g(\omega-\gamma\Delta B_z, T_s^s)\approx g(\omega,T_s^s)$. Although equation [3] defines $\langle W \rangle$ for single frequency irradiation, $\langle W \rangle$ may be readily calculated for RF pulses with multiple frequencies.

New RF Pulse Design. In solving the Bloch equation (equation [1]) for a (readout) RF pulse, matrix E and vector c may be neglected, as relaxation typically occurs over a longer timescale, hence the magnetization dynamics includes rotations determined by A. This may be solved by discretizing the sequence parameters in $N_t$ constant piecewise timesteps of duration $\Delta t$, each producing a rotation R(t):

$$M^f(t+\Delta t) = \exp(A(t)\Delta t)M^f(t) = R(t) = R(t)M^f(t) \quad [4]$$

whereas the full rotation $R^{full}$ of the magnetization may be calculated by concatenating all R(t).

Similarly, in the BSB model (equation [2]), relaxation and exchange occur over a longer timescale than the typical RF pulse and may be neglected when simulating the dynamics during the RF. The magnetization response is determined by $\tilde{A}$ and may also be solved by discretizing time:

$$\begin{bmatrix} M^f \\ M_z^s \end{bmatrix}(t + \Delta t) = \exp\left(\begin{bmatrix} A(t) & 0 \\ 0 & -\langle W \rangle \end{bmatrix}\Delta t\right)\begin{bmatrix} M^f \\ M_z^s \end{bmatrix}(t) \quad [5]$$

In the absence of exchange, the response of the free water and semisolid pools is decoupled ($\tilde{A}$ is block diagonal), and thus, the matrix exponential is the exponential of its diagonal terms. The full magnetization response to an RF pulse may then be calculated by concatenating the matrix exponentials from all $N_t$ timesteps over the duration $\tau$ of the RF:

$$\begin{bmatrix} M^f \\ M_z^s \end{bmatrix}(t + \tau) = \left(\prod_{t=1}^{N_t}\begin{bmatrix} R(t) & 0 \\ 0 & e^{-\langle W \rangle \Delta t} \end{bmatrix}\right)\begin{bmatrix} M^f \\ M_z^s \end{bmatrix}(t) = \begin{bmatrix} R^{full} & 0 \\ 0 & e^{-\langle W \rangle \tau} \end{bmatrix}\begin{bmatrix} M^f \\ M_z^s \end{bmatrix}(t), \quad [6]$$

where the free water and semisolid pools responses are independent from each other.

Thus, by understanding the magnetization response to an RF pulse, the RF pulse to cause the magnetization may be designed accordingly.

More specifically, the RF pulse may be designed to target a desired flip angle $\alpha_{tar}$ from rotation matrix $R^{full}$ (e.g., recall that $R^{full}$ depends on A, which itself depends on $B_1^+$ and local static field variations $\Delta B_z$, and therefore controls $\alpha$) for free water magnetization, and simultaneously control saturation of semisolid magnetization by targeting a desired average saturation rate $\langle W \rangle_{tar}$.

The RF pulse design for both pools may therefore be cast as a joint optimization, for example, in the form:

$$\{\hat{b}, \hat{G}\} := \underset{b,G}{\operatorname{argmin}}\{(1-\lambda)\|\alpha - \alpha_{tar}\|_2^2 + \lambda\|\langle W \rangle - \langle W \rangle_{tar}\|_2^2\} \quad [7]$$

where $\lambda \in [0,1]$ balances the error between the two terms, and b and G are the RF and gradient waveforms, respectively. Importantly, $\alpha$ (flip angle) depends on both b and G, while $\langle W \rangle$ (saturation) depends only on b.

Using equation [3] for single frequency irradiation, the problem of RF pulse design may be recast into one of controlling semisolid saturation using $\langle |B_1^+|^2 \rangle$ instead of $\langle W \rangle$. As an example implementation, the problem may be recast into:

$$\{\hat{b}, \hat{G}\} := \underset{b,G}{\operatorname{argmin}}\left\{(1-\lambda)\frac{\|\alpha(b, G) - \alpha_{tar}\|_2}{\|\alpha_{tar}\|_2} + \lambda\frac{\|\beta(b) - \beta_{tar}\|_2}{\|\beta_{tar}\|_2}\right\} \quad [8]$$

where $\beta$ is the root-mean-squared $B_1^+$.

Optimization (e.g., choice of target $\alpha_{tar}$ and target $\beta_{tar}$) may be performed under safety (e.g., patient specific absorption rate) and hardware (e.g., peak and average power, gradient amplitude, and slew rate) constraints.

Example Results. To test the pulse design, kT-points were used as a method to homogenize the flip angle $\alpha$ towards a target $\alpha_{tar}=16°$, and modified to also account for $\beta$ and homogenize $\beta$ towards a target $\beta_{tar}=0.2$ µT. In each of FIGS. 1 to 6, the first row shows RF amplitudes (b) on each transmit channel (left), assuming a multichannel RF transmitter, and gradient moments related to G (right). The middle row shows the resulting flip angle (left) and $B_1^+$ RMS (right). The bottom row represents the errors to the respective targets.

FIG. 1 shows a result obtained with $\lambda=0$, where the flip angle is well optimized to be homogeneous across the brain, but $\beta$ is ignored and ends up being very high and inhomogeneous (see, e.g., the $\Delta\beta$ graph). In other words, FIG. 1 shows an example result equivalent to if only problem (a) above was focused on and the saturation (problem (b)) was ignored. $\beta$ values as high as 1 µT are observed, which is of the order of what a dedicated MT pulse would achieve, demonstrating the principle that any excitation pulse may cause some saturation thereby impacting a dedicated MTR image.

Figure 2:
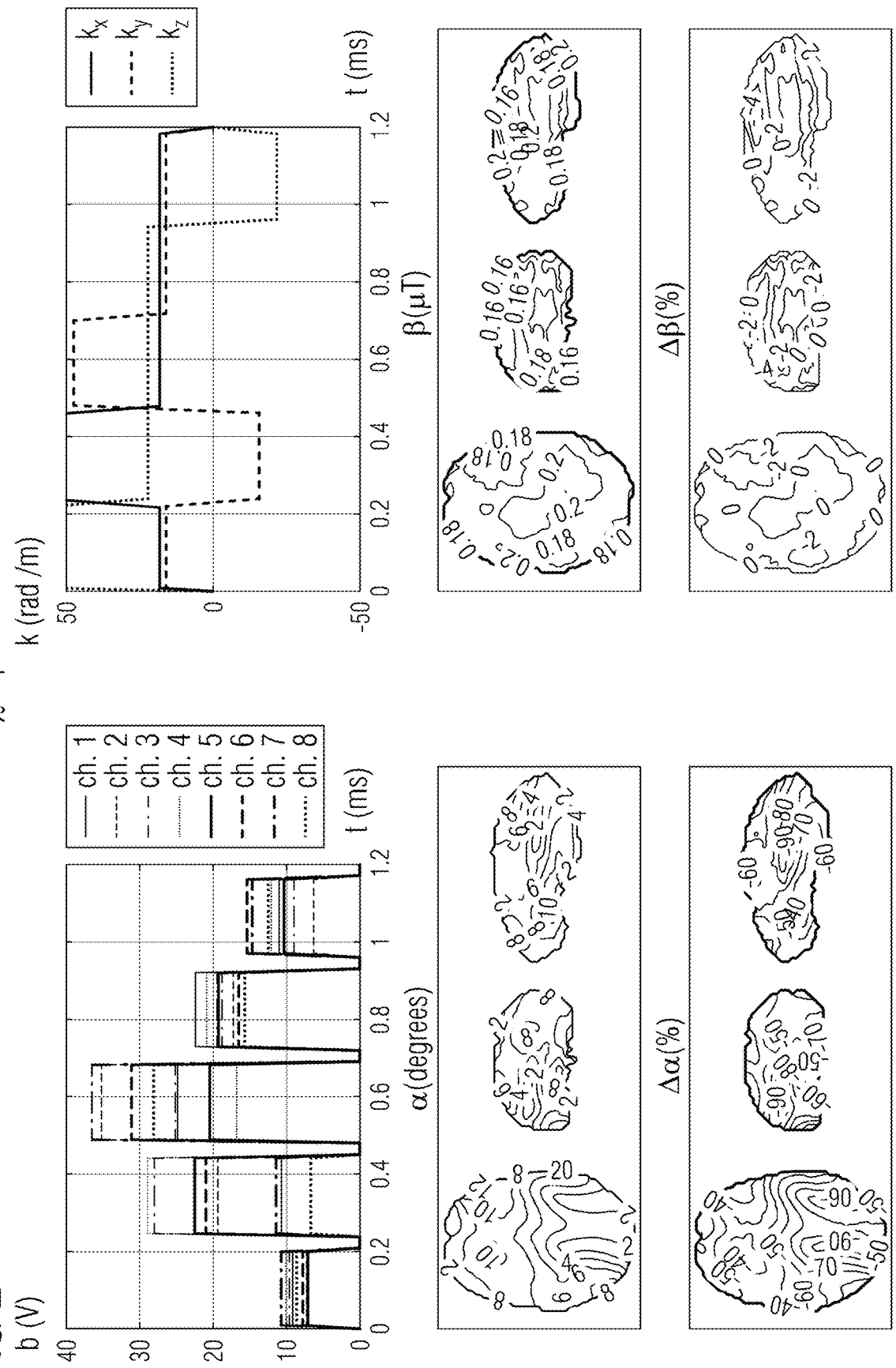
Figure 3:
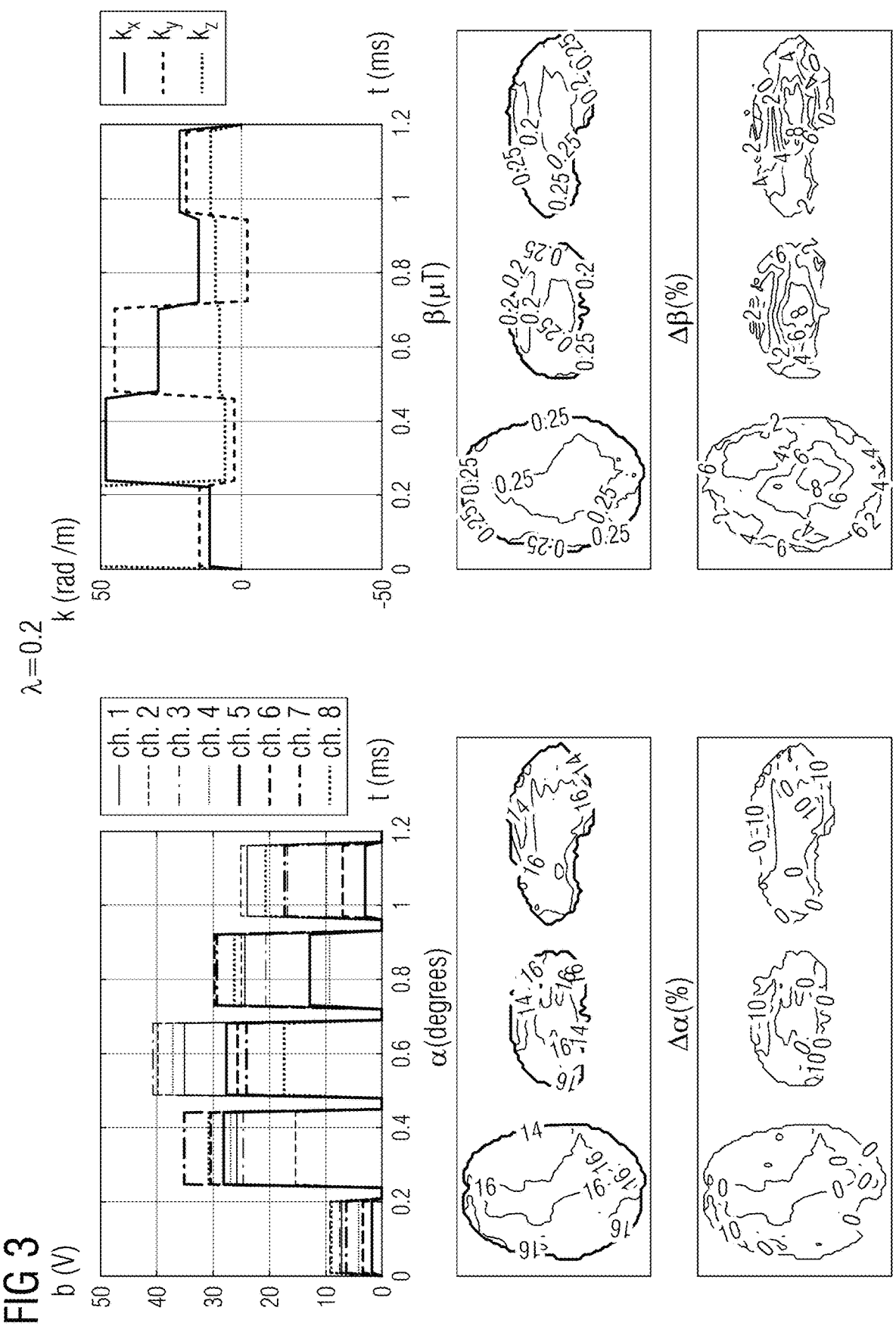
Figure 4:
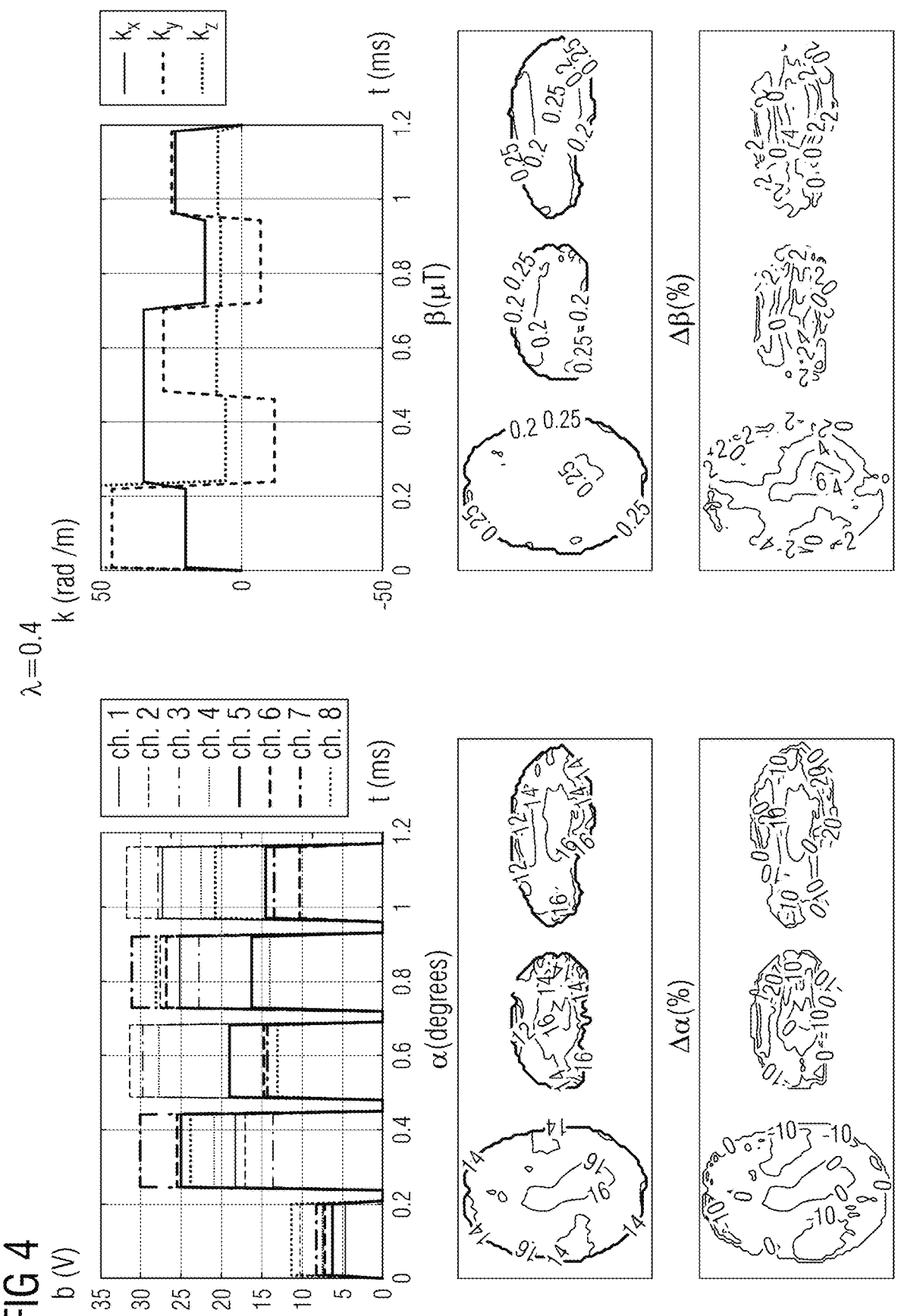
Figure 5:
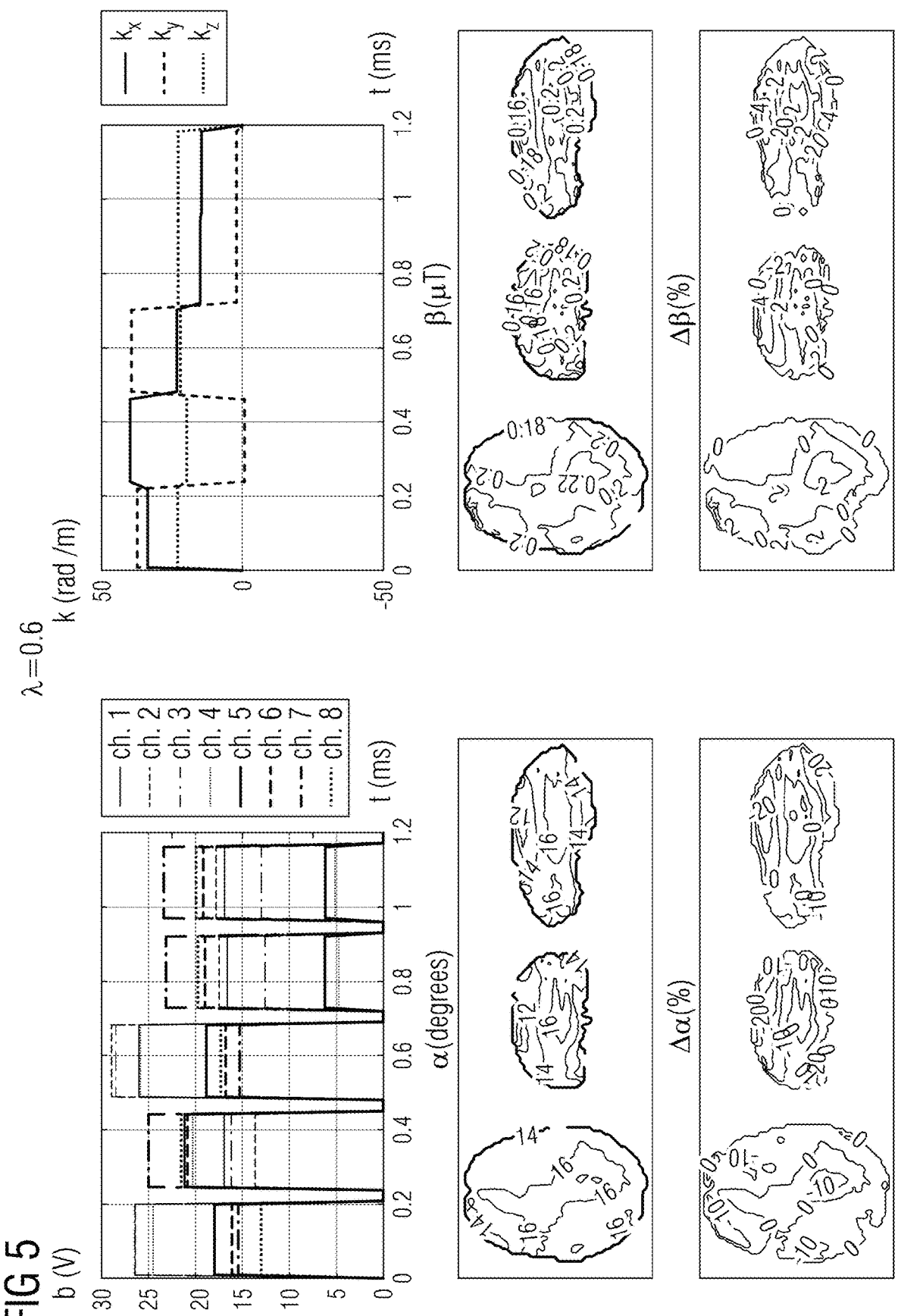
Figure 6:
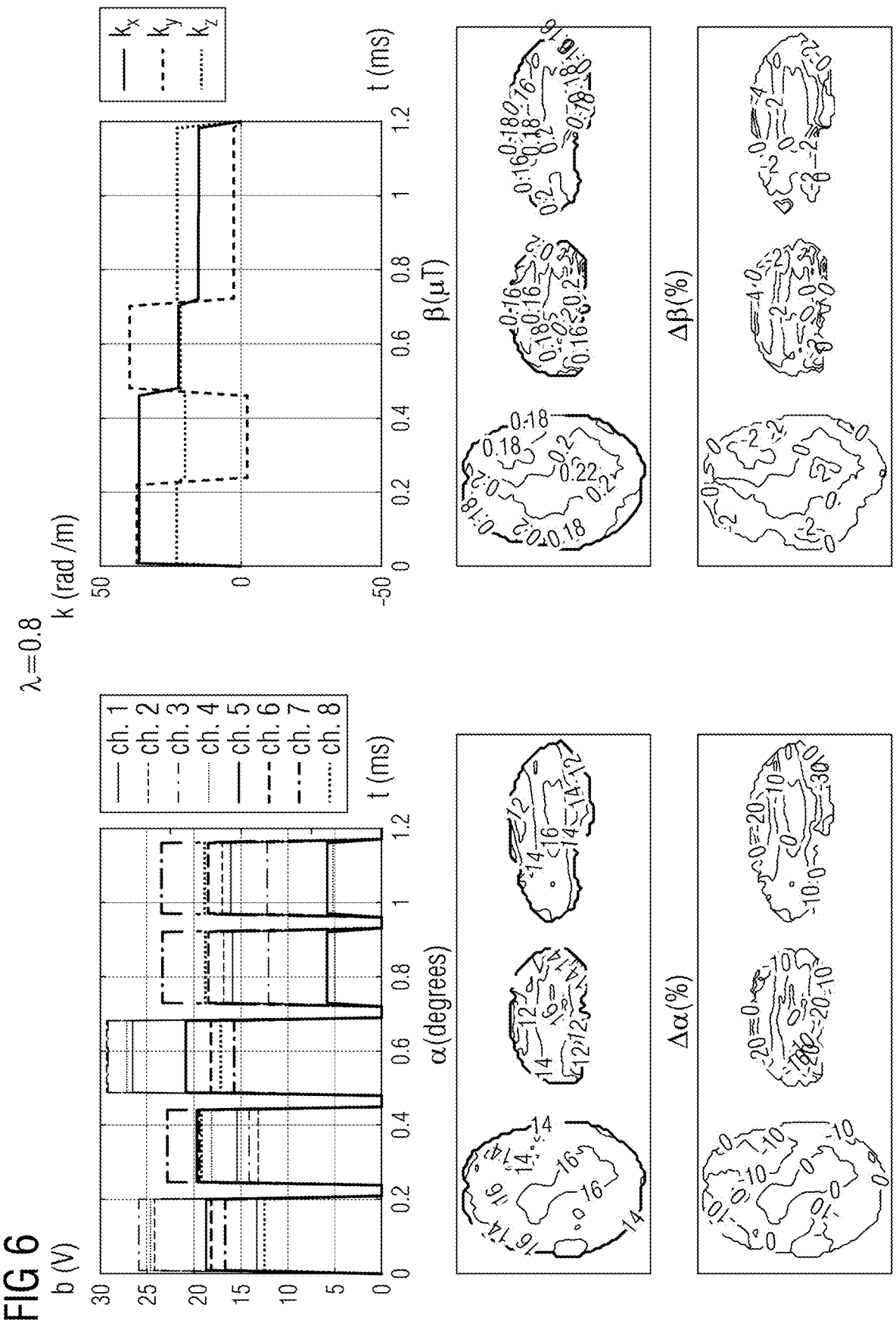

FIG. 2 shows the opposite situation, where $\lambda=1$ is chosen to homogenize only $\beta$, ignoring flip angle entirely (see, e.g., the $\Delta\alpha$ graph). This results in a homogeneous $\beta$, close to its 0.2 µT target, but completely off-target flip angle.

FIGS. 3 to 6 demonstrates a result with intermediate $\lambda=0.2, 0.4, 0.6, 0.8$, respectively. In these examples, both flip angle and $B_1^+$ RMS are homogeneous and near their target. Put another way, each of FIGS. 3 to 6 achieve a satisfactory degree of homogeneous excitation together with RF power. The results of such improved targeting of a and P are images with improved contrast due to reduced SNR.

Figure 7:
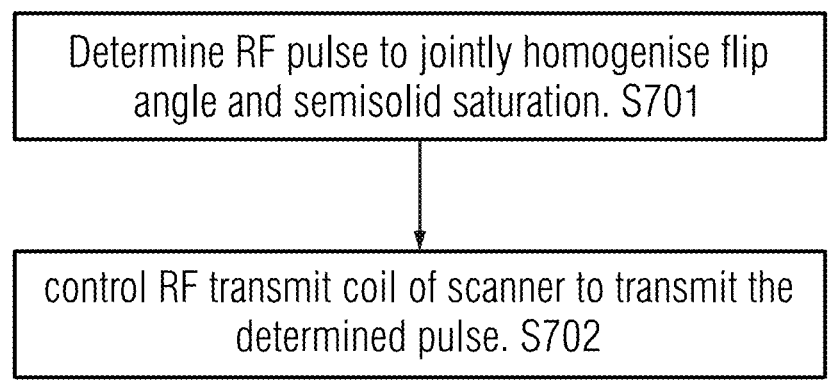
FIG. 7 is a flow chart showing an example method of controlling a magnetic resonance (MR) scanner.

Implementation. FIG. 7 shows a flow chart of example acts for controlling a magnetic resonance scanner to provide an RF pulse for MT imaging (or more generally to control MT effects in conventional imaging). The method may be performed by a computer arranged to control operations of the MR scanner (e.g., the method may be written in computer code and executed by the computer). The same computer may then be used to process image signals received from the MR scanner, or a dedicated image processor device/computer may be used for that purpose.

At act 701, an RF pulse that jointly homogenizes flip angle and magnetization saturation is determined (e.g., calculated by the control computer). In other words, parameters for an RF pulse that are expected to simultaneously provide good homogeneity of the flip angle across a sample and good homogeneity of magnetization saturation across a sample are determined. Here, "good" homogeneity may be that a deviation in the flip angle and/or saturation from a target value is no more than 20% of that target value. Other values to determine a "good" homogeneity may also be used (e.g., no more than 10% deviation or no more than 5% deviation).

At act 702, the MR scanner is controlled to output the determined (e.g., calculated) RF pulse. In other words, an RF transmit coil of the MR scanner is controlled to transmit the determined RF pulse. If the MR scanner includes more than one RF transmit coil, the pulse may be transmitted by a combination of coils. More specifically, the control computer communicates a suitable control signal to the MR scanner that then controls the RF transmit coil accordingly.

In this way, an MT image with improved and, for example, homogenous contrast may be obtained when imaging using the MR scanner.

Figure 8:
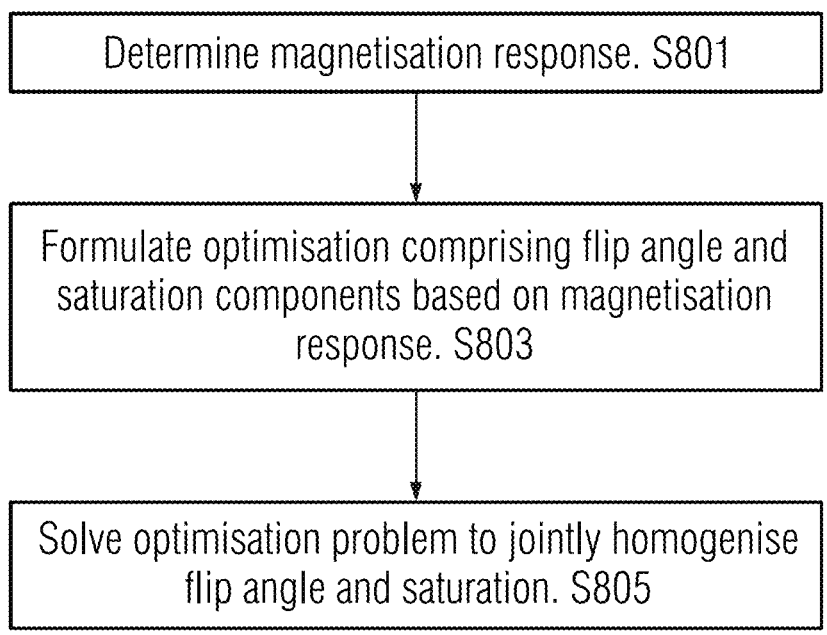
FIG. 8 is a flow chart showing an example method for determining an example RF pulse to be transmitted by an MR scanner.

FIG. 8 shows one example of determining a suitable RF pulse (e.g., act 701) in more detail.

At act 801, a magnetization response of the sample to an RF pulse is determined. The magnetization response includes a component for the response of the free water pool and the magnetization response to the semisolid pool. In one embodiment, these responses are decoupled when determining the magnetization response. In other words, the magnetization response may include an independent free water component and independent semisolid component. See, e.g., equations [4] to [6].

At act 803, the magnetization response is used to formulate an optimization problem, whereby the RF pulse design depends on a flip angle component and saturation component. See, e.g., equation [7]. The saturation is dependent on the power of the RF pulse, and so, the optimization problem may also be recast in terms of power (see, e.g., equation [8]).

At act 805, the optimization problem is solved to jointly homogenize a flip angle and a semi-solid saturation that would arise from the designed pulse.

Figure 9:
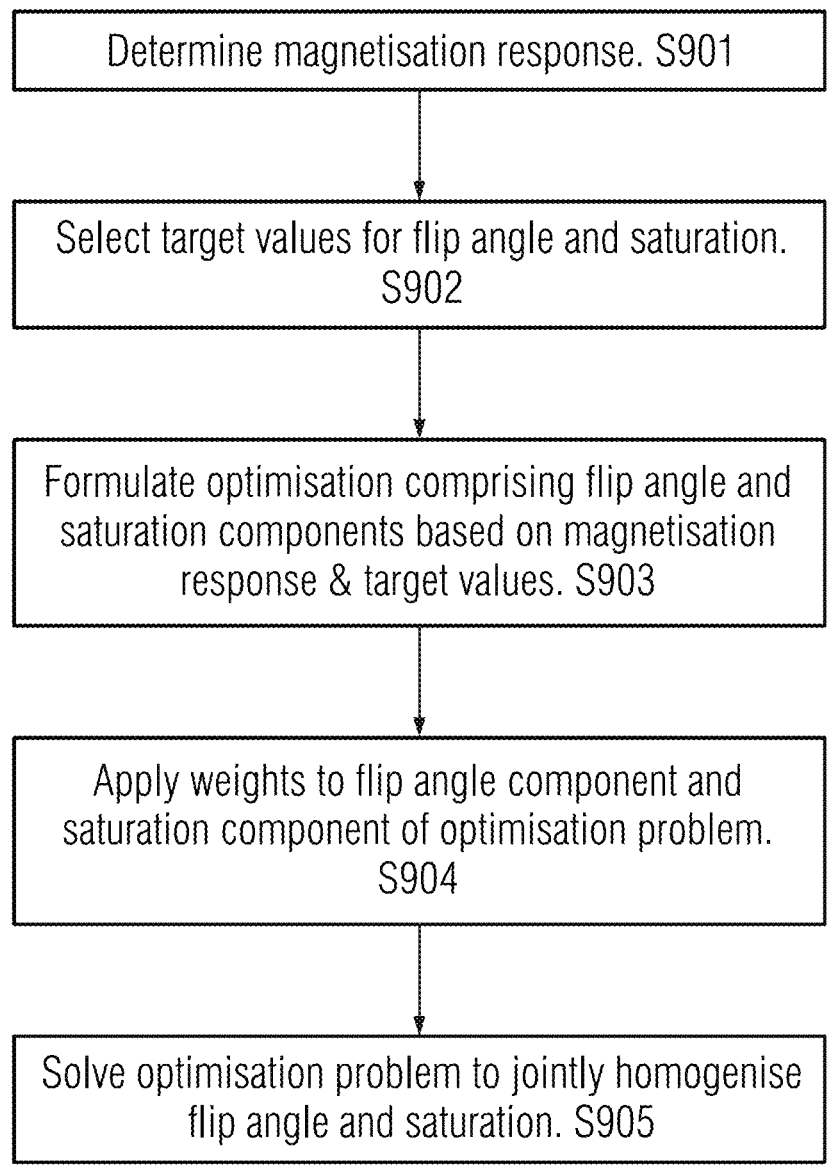
FIG. 9 is a flow chart showing another example method for determining an example RF pulse to be transmitted by an MR scanner.

FIG. 9 shows another example of designing a suitable RF pulse. Here, the acts 901, 903, 905 are substantially the same as acts 801, 803, 805 in FIG. 8 (modified where appropriate as discussed below).

At act 902, a target flip angle and a target magnetization saturation are selected. The flip angle and saturation level are selected based on patient safety and hardware considerations. In some implementations, a target root-mean-squared $B_1^+$ (which depends on power) is selected instead of saturation; in other words, a particular power for the RF pulse may be targeted. These targets are then used in the formulation of the optimization problem at act 903 as parameters in the respective flip angle and saturation components.

For example, when the readout sequence is a gradient echo 'GRE' sequence, the targeted flip angle may be less than 90 degrees (e.g., in the range of 10 degrees to 80 degrees). A larger flip angle gives more T1 sample weighting, whereas smaller flip angle gives more T2 sample weighting.

In another example, when the readout sequence is a spin-echo pulse sequence, a first RF pulse that targets a flip angle of 90 degrees may be designed, followed by a second (or more) RF pulse targeting a flip angle of 180 degrees.

At act 904, a weighting factor is applied to the flip angle component and saturation component of the optimization problem. The weighting factor allows modification of which component (e.g., flip angle or saturation) is given priority. The weighting factor therefore allows for varying performance of the MR scanner to achieve a desired contrast on the resulting MT image(s).

In one embodiment, the weights applied to the two components sum to 1. This is most readily achieved by having the two weights depend on a single trade-off factor (e.g., A above). The trade-off factor is single valued and varies between 0 and 1 (e.g., exclusive). In one embodiment, the trade-off factor is between 0.2 and 0.8, as this allows scope for prioritizing one of the flip angle and saturation with respect to the other. Selecting a trade-off factor close to either 0 or 1 has little benefit, as such results would be very close to images achievable by known solutions that focus only on flip angle or only on MT effects. It is envisaged that selecting a suitable trade-off factor (or more generally weights) will include an element of trial and error during a setup phase of the MR scanner (e.g., imaging equipment).

At act 905, solving the optimization problem includes minimizing deviations of the flip angle and saturation from the target values, respectively.

Figure 10:
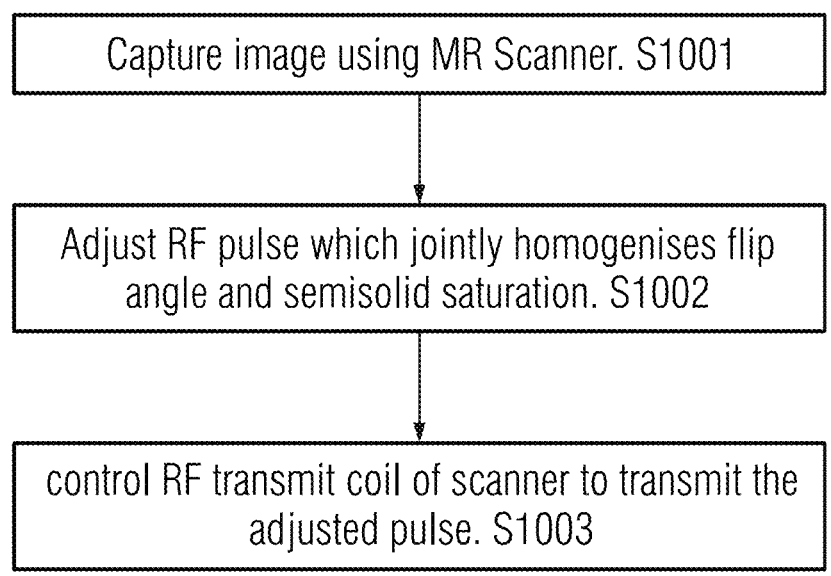
FIG. 10 is a flow chart showing yet another example method for determining an example RF pulse to be transmitted by an MR scanner.

FIG. 10 shows a further example of determining a suitable RF pulse that jointly homogenizes flip angle and magnetization, which expands on the principles of FIGS. 7 to 9.

At act 1001, an image from the MR scanner is captured. The image is produced by the RF pulse determined by the methods above. Optionally, the image is displayed to a device operator; however, the image may also be analyzed automatically without being displayed.

At act 1002, the design of the RF pulse is adjusted based on analysis of the image. More specifically, the weights, target flip angle, and target saturation/power, or any combination thereof may be changed to change the RF pulse design and thereby change a contrast of the next image captured by the MR scanner.

At act 1003, the MR scanner is controlled to transmit the adjusted RF pulse.

Figure 11:
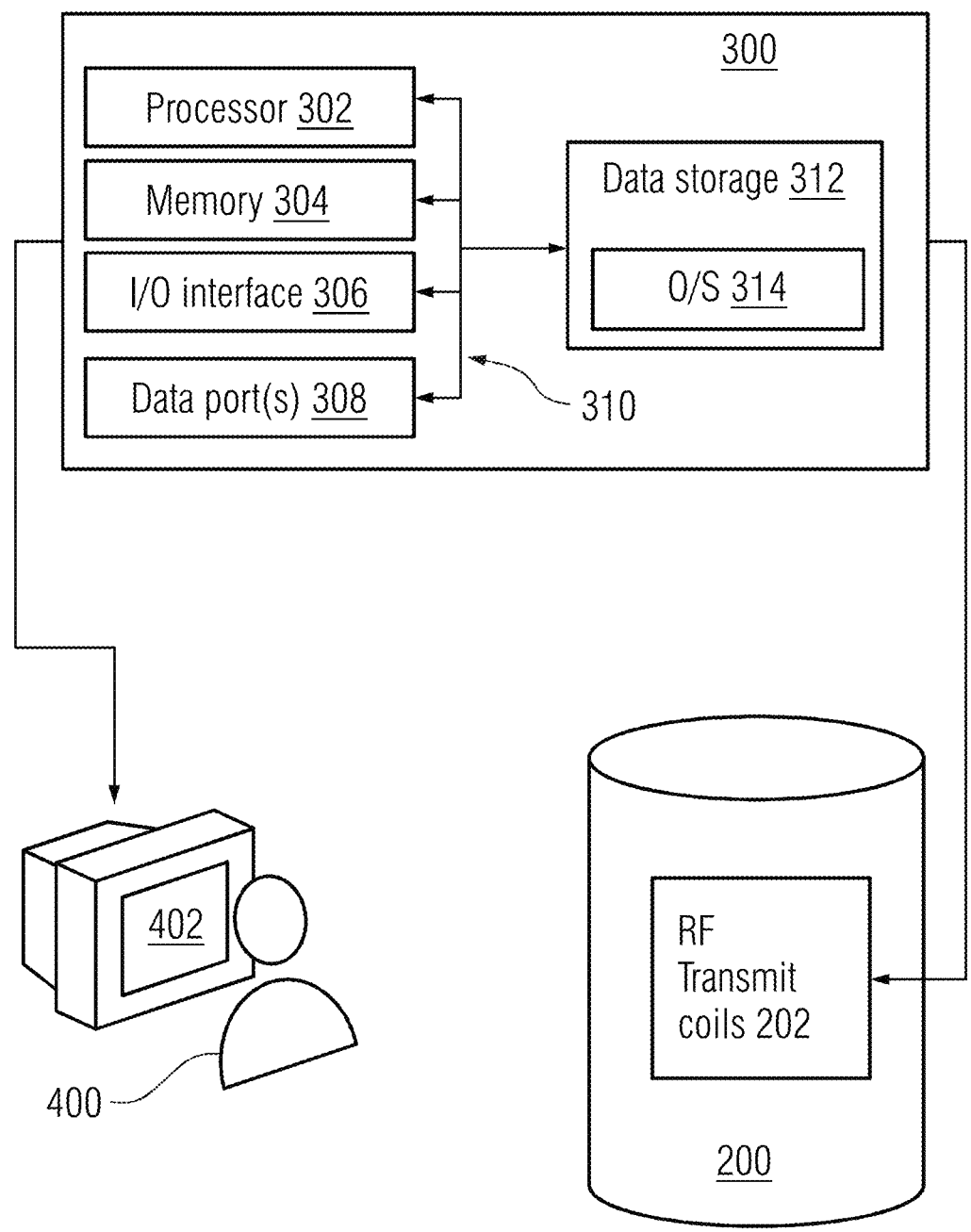
FIG. 11 shows a block diagram of an example imaging system.

Example Hardware. FIG. 11 is a block diagram of components of an imaging system 100 configured to apply the methods above. The imaging system 100 (e.g., an MRI apparatus) captures image data or signals that may be used to generate an image using a magnetic resonance scanner 200 that is controlled by a controller 300 (or more generally control).

The MR scanner 200 includes a magnet (not shown) for establishing a stationary magnetic field. The magnet may include a permanent magnet, a superconducting magnet, or other type of magnet. The scanner includes an excitation system (not shown) that may also include a receiver (not shown). The MR scanner may include a gradient arrangement (not shown) configured to apply a magnetic field gradient, and, for example, a gradient arrangement configured to generate magnetic field gradients along three mutually orthogonal direction x, y, z. The gradient arrangement includes one or more coils (not shown) used to apply magnetic gradients for localization during MR imaging.

The scanner 200 includes one or more RF transmit coils 202 (e.g., as part of the excitation system) that are in communication with the controller 300 (e.g., controlled by the controller 300) and are configured to transmit a pulse designed according to the discussion herein (e.g., a readout RF pulse for producing the aforementioned images). A particular example of a scanner 200 including multiple RF transmit coils is a parallel transmit (pTx) scanner.

In this example, the controller 300 also provides image processing, though it will be appreciated that a general control device for the MR scanner 200 and an image processor for receiving and analyzing images may be different devices (or networks of devices). Thus, the image data or signals are sent to a scanner controller 300. The output of the image processing (e.g., a generated image) may be output to a user 400 via any suitable user interface 402 (e.g., a screen on a computer or other electronic device).

The controller 300 may be an integrated component of the MR apparatus 200. The controller 300 may be a desktop computer, a workstation, a server, or a laptop computer. The controller 300 may be formed from multiple devices (e.g., multiple servers). The acts (or tasks) discussed previously may be split across the computer, one or more servers, or the cloud. The controller 300 may include one or more processors 302, one or more memory devices 304 (generically referred to herein as memory 304), one or more input/output ("I/O") interface(s) 306, one or more data ports 308, and data storage 312. The controller 300 may further include one or more buses 310 that functionally couple various components of the controller 300.

The data storage 312 may store one or more operating systems (O/S) 314; and one or more program modules, applications, engines, computer-executable code, scripts, or the like. Any of the components depicted as being stored in data storage 312 may include any combination of software, firmware, and/or hardware. The software and/or firmware may include computer-executable code, instructions, or the like that may be loaded into the memory 304 for execution by one or more of the processors 302 to perform any of the methods described herein.

The data storage 312 may additionally store various types of data that may be copied to memory 304 for use by the processor(s) 302 during the execution of the computer-executable instructions. Further, output data generated as a result of execution of the computer-executable instructions by the processor(s) 302 may be stored initially in memory 304, and may ultimately be copied to data storage 312 for non-volatile storage.

The data storage 312 may include removable storage and/or non-removable storage including, but not limited to, magnetic storage, optical disk storage, and/or tape storage. The data storage 312 may provide non-volatile storage of computer-executable instructions and other data. The memory 304 and the data storage 312, removable and/or non-removable, are examples of computer-readable storage media (CRSM).

The bus(es) 310 may include a system bus, a memory bus, an address bus, a message bus, or any combination thereof, and may permit exchange of information (e.g., data (including computer-executable code), signaling, etc.) between various components of the controller 300.

The memory 304 of the controller 300 may include volatile memory (e.g., memory that maintains its state when supplied with power) such as random access memory (RAM) and/or non-volatile memory (e.g., memory that maintains its state even when not supplied with power), such as read-only memory (ROM), flash memory, ferroelectric RAM (FRAM), and so forth. Persistent data storage, as that term is used herein, may include non-volatile memory.

In some implementations, the memory 304 may include multiple different types of memory such as various types of static random access memory (SRAM), various types of dynamic random access memory (DRAM), various types of unalterable ROM, and/or writeable variants of ROM such as electrically erasable programmable read-only memory (EEPROM), flash memory, and so forth. The memory 304 may include main memory as well as various forms of cache memory such as instruction cache(s), data cache(s), translation lookaside buffer(s) (TLBs), and so forth.

The processor(s) 302 may be configured to access the memory 304 and execute computer-executable instructions loaded therein. For example, the processor(s) 302 may be configured to execute computer-executable instructions of the various program modules, applications, engines, or the like of the system to cause or facilitate various operations to be performed in accordance with one or more embodiments of the disclosure. The processor(s) 302 may include any suitable processing unit capable of accepting data as input, processing the input data in accordance with stored computer-executable instructions, and generating output data. The processor(s) 302 may have any suitable microarchitecture design. The processor(s) 302 may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth.

The O/S 314 may be loaded from the data storage 312 into the memory 304 and may provide an interface between other application software executing on the controller 300 and hardware resources of the controller 300. More specifically, the O/S 314 may include a set of computer-executable instructions for managing hardware resources of the system and for providing common services to other application programs (e.g., managing memory allocation among various application programs). In certain example embodiments, the O/S 314 may control execution of one or more of the program modules depicted as being stored in the data storage 312. The O/S 314 may include any operating system now known or that may be developed in the future including, but not limited to, any server operating system, any mainframe operating system, or any other proprietary or non-proprietary operating system.

The input/output (I/O) interface(s) 306 may facilitate the receipt of input information by the controller 300 from one or more I/O devices as well as the output of information from the controller 300 to the one or more I/O devices. The I/O devices may include any of a variety of components such as: a display or display screen having a touch surface or touchscreen; an audio output device for producing sound, such as a speaker; an audio capture device, such as a microphone; an image and/or video capture device, such as a camera; a haptic unit; and so forth. Any of these components may be integrated into the controller 300 or may be separate. The I/O devices may further include, for example, any number of peripheral devices such as data storage devices, printing devices, and so forth.

The I/O interface(s) 306 may also include an interface for an external peripheral device connection such as universal serial bus (USB), FireWire, Thunderbolt, Ethernet port, or other connection protocol that may connect to one or more networks. The I/O interface(s) 306 may also include a connection to one or more antennas to connect to one or more networks via a wireless local area network (WLAN) (e.g., Wi-Fi) radio, Bluetooth, and/or a wireless network radio, such as a radio capable of communication with a wireless communication network such as a Long Term Evolution (LTE) network, WiMAX network, 3G network, etc.

The controller 300 may further include one or more data ports 308 via which the controller 300 may communicate with any of the processing modules. For example, the data ports(s) 308 may enable communication with the scanner 200.

The engines and the program modules depicted in the figures are merely illustrative and not exhaustive, and that processing described as being supported by any particular engine or module may alternatively be distributed across multiple engines, modules, or the like, or performed by a different engine, module, or the like. In addition, various program module(s), script(s), plug-in(s), Application Programming Interface(s) (API(s)), or any other suitable computer-executable code hosted locally on the system and/or hosted on other computing device(s) accessible via one or more of the network(s), may be provided to support the provided functionality, and/or additional or alternate functionality. Further, functionality may be modularized differently such that processing described as being supported collectively by the collection of engines or the collection of program modules may be performed by a fewer or greater number of engines or program modules, or functionality described as being supported by any particular engine or module may be supported, at least in part, by another engine or program module. In addition, engines or program modules that support the functionality described herein may form part of one or more applications executable across any number of devices of the system in accordance with any suitable computing model such as, for example, a client-server model, a peer-to-peer model, and so forth. In addition, any of the functionality described as being supported by any of the engines or program modules may be implemented, at least partially, in hardware and/or firmware across any number of devices.

The system may include alternate and/or additional hardware, software, or firmware components beyond those described or depicted without departing from the scope of the disclosure. More particularly, software, firmware, or hardware components depicted as forming part of the system are merely illustrative, and some components may not be present or additional components may be provided in various embodiments. While various illustrative engines have been depicted and described as software engines or program modules, functionality described as being supported by the engines or modules may be enabled by any combination of hardware, software, and/or firmware. Each of the above-mentioned engines or modules may, in various embodiments, represent a logical partitioning of supported functionality. This logical partitioning is depicted for ease of explanation of the functionality and may not be representative of the structure of software, hardware, and/or firmware for implementing the functionality. Accordingly, functionality described as being provided by a particular engine or module may, in various embodiments, be provided at least in part by one or more other engines or modules. Further, one or more depicted engines or modules may not be present in certain embodiments, while in other embodiments, additional engines or modules not depicted may be present and may support at least a portion of the described functionality and/or additional functionality. Further, while certain engines modules may be depicted or described as sub-engines or sub-modules of another engine or module, in certain embodiments, such engines or modules may be provided as independent engines or modules or as sub-engines or sub-modules of other engines or modules.

The operations described and depicted in the illustrative methods of FIGS. 7 to 10 may be carried out or performed in any suitable order as desired in various example embodiments of the disclosure. Additionally, in certain example embodiments, at least a portion of the operations may be carried out in parallel.

Although specific embodiments of the disclosure have been described, one of ordinary skill in the art will recognize that numerous other modifications and alternative embodiments are within the scope of the disclosure. For example, any of the functionality and/or processing capabilities described with respect to a particular system, system component, device, or device component may be performed by any other system, device, or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. One or more blocks of the block diagrams and flow diagrams, and combinations of blocks in the block diagrams and the flow diagrams, respectively, may be implemented by execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or acts for performing the specified functions, and program instruction means for performing the specified functions. Each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Program modules, applications, or the like disclosed herein may include one or more software components including, for example, software objects, methods, data structures, or the like. Each such software component may include computer-executable instructions that, responsive to execution, cause at least a portion of the functionality described herein (e.g., one or more operations of the illustrative methods described herein) to be performed.

A software component may be coded in any of a variety of programming languages. An illustrative programming language may be a lower-level programming language such as an assembly language associated with a particular hardware architecture and/or operating system platform. A software component including assembly language instructions may require conversion into executable machine code by an assembler prior to execution by the hardware architecture and/or platform.

Another example programming language may be a higher-level programming language that may be portable across multiple architectures. A software component including higher-level programming language instructions may require conversion to an intermediate representation by an interpreter or a compiler prior to execution.

Other examples of programming languages include, but are not limited to, a macro language, a shell or command language, a job control language, a script language, a database query or search language, or a report writing language. In one or more example embodiments, a software component including instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may include other custom-developed application software, operating system functionality (e.g., device drivers, data storage (file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Further, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or acts to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium that may be used to store the information and that may be accessed. Combinations of any of the above are also included within the scope of CRSM Alternatively, computer-readable communication media (CRCM) may include computer-readable instructions, program modules, or other data transmitted within a data signal, such as a carrier wave, or other transmission. However, as used herein, CRSM does not include CRCM.

Although embodiments have been described in language specific to structural features and/or methodological acts, the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments may include, while other embodiments do not include, certain features, elements, and/or acts. Thus, such conditional language is not generally intended to imply that features, elements, and/or acts are in any way required for one or more embodiments or that one or more embodiments necessarily include logic for deciding, with or without user input or prompting, whether these features, elements, and/or acts are included or are to be performed in any particular embodiment.

Attention is directed to all papers and documents that are filed concurrently with or previous to this specification in connection with this application and that are open to public inspection with this specification, and the contents of all such papers and documents are incorporated herein by reference.

All of the features disclosed in this specification (including any accompanying claims and drawings), and/or all of the acts of any method or process so disclosed, may be combined in any combination, except combinations where at least some of such features and/or acts are mutually exclusive.

Each feature disclosed in this specification (including any accompanying claims and drawings) may be replaced by alternative features serving the same, equivalent, or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims and drawings), or to any novel one, or any novel combination, of the acts of any method or process so disclosed.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method of operating a magnetic resonance (MR) scanner, the method comprising:
    determining, by a processor, a radiofrequency (RF) pulse to be transmitted to jointly homogenize a flip angle and a semi-solid saturation that would result from magnetization of a sample to be scanned by the MR scanner using the determined RF pulse;
    controlling an RF transmit coil of the MR scanner to transmit the determined RF pulse; and
    acquiring at least one image of the sample scanned by the MR scanner using the determined RF pulse.

2. A magnetic resonance imaging (MRI) apparatus comprising:
    a magnetic resonance (MR) scanner; and
    a computer for controlling operation of the MR scanner, the computer being configured to:

determine a radiofrequency (RF) pulse to be transmitted to jointly homogenize a flip angle and a semi-solid saturation that would result from magnetization of a sample to be scanned by the MR scanner using the determined RF pulse;

control an RF transmit coil of the MR scanner to transmit the determined RF pulse; and acquire at least one image of the sample scanned by the MR scanner using the determined RF pulse.

3. A non-transitory computer-readable storage medium that stores a computer program comprising instructions that, when executed by a computer, control an operation of a magnetic resonance (MR) scanner, the instructions comprising:

determining a radiofrequency (RF) pulse to be transmitted to jointly homogenize a flip angle and a semi-solid saturation that would result from magnetization of a sample to be scanned by the MR scanner using the determined RF pulse;

controlling an RF transmit coil of the MR scanner to transmit the determined RF pulse; and acquiring at least one image of the sample scanned by the MR scanner using the determined RF pulse.

4. A non-transitory data carrier carrying code that, when implemented by a computer, control an operation of a magnetic resonance (MR) scanner, the control of the operation of the MR scanner comprising:

determination of a radiofrequency (RF) pulse to be transmitted to jointly homogenize a flip angle and a semi-solid saturation that would result from magnetization of a sample to be scanned by the MR scanner using the determined RF pulse;

control of an RF transmit coil of the MR scanner to transmit the determined RF pulse; and acquisition of at least one image of the sample scanned by the MR scanner using the determined RF pulse.

5. The method of claim 1, wherein the determining of the RF pulse to be transmitted comprises applying a first weight to a component of an RF pulse design that determines the flip angle of the sample when magnetized.

6. The method of claim 1, wherein the determining the RF pulse to be transmitted comprises selecting a target flip angle and minimizing a deviation of a flip angle resulting from magnetization of the sample with respect to the target flip angle.

7. The method of claim 1, wherein the determining of the RF pulse to be transmitted comprises selecting a target saturation and minimizing a deviation of saturation resulting from magnetization of the sample with respect to the target saturation.

8. The method of claim 1, wherein the determining of the RF pulse to be transmitted comprises determining a target power for the RF pulse and minimizing an actual power of the RF pulse with respect to the target power.

9. The MRI apparatus of claim 2, wherein the MR scanner comprises multiple parallel transmit RF coils, and the determined RF pulse is transmitted by the multiple parallel transmit RF coils in combination.

10. The method of claim 5, wherein the determining of the RF pulse to be transmitted comprises applying a second weight to a component of the RF pulse design that determines the semi-solid saturation of the sample when magnetized.

11. The method of claim 6, wherein the target flip angle is based on safety constraints of the MR scanner, hardware constraints of the MR scanner, or a combination thereof.

12. The method of claim 10, wherein applying the first weight to the component of the RF pulse design that determines the flip angle and applying the second weight to the component of the RF pulse design that determines semi-solid saturation comprise selecting a trade-off factor to be used in both the first weight and the second weight.

13. The method of claim 11, wherein the safety constraints include patient specific absorption rate.

14. The method of claim 11, wherein the hardware constraints include peak RF power, average RF power, static field gradient amplitude, static field gradient slew rate of the MR scanner, or any combination thereof.

15. The method of claim 12, wherein the trade-off factor is greater than 0 and less than 1.

16. The method of claim 12, further comprising adjusting the determined RF pulse based on the at least one image.

17. The method of claim 15, wherein the trade-off factor is between 0.2 and 0.8, inclusive.

18. The method of claim 16, wherein adjusting the determined RF pulse based on the at least one image includes adjusting the trade-off factor.

* * * * *